(12) United States Patent
Chang et al.

(10) Patent No.: US 8,309,445 B2
(45) Date of Patent: Nov. 13, 2012

(54) BI-DIRECTIONAL SELF-ALIGNED FET CAPACITOR

(75) Inventors: Leland Chang, Yorktown Heights, NY (US); Brian L. Ji, Yorktown Heights, NY (US); Chung-Hsun Lin, Yorktown Heights, NY (US); Jeffrey W. Sleight, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 318 days.

(21) Appl. No.: 12/616,861

(22) Filed: Nov. 12, 2009

(65) Prior Publication Data
US 2011/0108900 A1    May 12, 2011

(51) Int. Cl.
*H01L 21/336*    (2006.01)
*H01L 21/425*    (2006.01)
*H01L 29/94*    (2006.01)

(52) U.S. Cl. ........ 438/525; 438/302; 438/395; 438/252; 438/529

(58) Field of Classification Search .......... 257/532, 257/E29.345; 438/302, 525, 529, 231, 239, 438/394, 395, 251, 252
See application file for complete search history.

(56) References Cited

U.S. PATENT DOCUMENTS

| | | | | |
|---|---|---|---|---|
| 5,341,009 | A | * | 8/1994 | Young et al. .......... 257/296 |
| 6,107,129 | A | * | 8/2000 | Gardner et al. .......... 438/230 |
| 6,144,076 | A | | 11/2000 | Puchner et al. |
| 6,329,235 | B1 | | 12/2001 | Kuo |
| 6,541,840 | B1 | | 4/2003 | Terayama et al. |
| 6,608,365 | B1 | | 8/2003 | Li et al. |
| 7,060,553 | B2 | | 6/2006 | Fried et al. |
| 7,345,334 | B2 | | 3/2008 | Nowak et al. |
| 2001/0000414 | A1 | * | 4/2001 | Fukayama et al. .......... 257/596 |
| 2001/0019869 | A1 | | 9/2001 | Hsu |
| 2004/0087094 | A1 | | 5/2004 | Wristers et al. |
| 2006/0091490 | A1 | | 5/2006 | Chen et al. |
| 2006/0258072 | A1 | | 11/2006 | Kavalieros et al. |
| 2008/0035977 | A1 | | 2/2008 | Edward et al. |
| 2009/0121258 | A1 | | 5/2009 | Kumar |

(Continued)

FOREIGN PATENT DOCUMENTS

EP    1742271 A1    1/2007
(Continued)

OTHER PUBLICATIONS

International Search Report; International Application No. PCT/EP2010/064591; International Filing Date: Sep. 30, 2010; Date of Mailing: Nov. 30, 2010.

(Continued)

*Primary Examiner* — Matthew W Such
*Assistant Examiner* — Scott Stowe
(74) *Attorney, Agent, or Firm* — Cantor Colburn LLP; Vazken Alexanian

(57) ABSTRACT

A method of forming a field effect transistor (FET) capacitor includes forming a channel region; forming a gate stack over the channel region; forming a first extension region on a first side of the gate stack, the first extension region being formed by implanting a first doping material at a first angle such that a shadow region exists on a second side of the gate stack; and forming a second extension region on the second side of the gate stack, the second extension region being formed by implanting a second doping material at a second angle such that a shadow region exists on the first side of the gate stack.

6 Claims, 6 Drawing Sheets

U.S. PATENT DOCUMENTS

2009/0221123 A1 9/2009 Griebenow et al.
2009/0224290 A1 9/2009 Miyashita
2010/0032763 A1 2/2010 Pillarisetty et al.

FOREIGN PATENT DOCUMENTS

JP 2004071722 A 3/2004

OTHER PUBLICATIONS

International Search Report—Written Opinion; International Application No. PCT/EP2010/064591; International Filing Date: Sep. 30, 2010; Date of Mailing: Nov. 30, 2010.

* cited by examiner

BI-DIRECTIONAL SELF-ALIGNED FET CAPACITOR

BACKGROUND

The present invention relates to energy storage devices, and more specifically, to field effect transistor (FET) capacitors.

In silicon on insulator (SOI) technologies, creating a decoupling FET capacitor is a known process. Typically, creating a decoupling FET capacitor includes creating source and drain regions adjacent a channel. The source and drain are both typically doped in the same manner. For example, both the source and drain could be N+ doped or both are P+ doped. Such doping works fine for a unidirectional capacitor.

Building a capacitor, however, that would work in both bias directions is not straightforward. Such a capacitor would need to be able to store charge regardless of whether $V_{dd}$ or a reference voltage (ground) is applied to the gate of the decoupling capacitor. For a capacitor to work in accumulation mode in SOI, a body tie is required, and this would normally have problems with parasitic resistances and capacitances that would limit the operation.

SUMMARY

According to one embodiment of the present invention, a method of forming a field effect transistor (FET) capacitor is disclosed. The method includes forming a channel region; forming a gate stack over the channel region; forming a first extension region on a first side of the gate stack, the first extension region being formed by implanting a first doping material at a first angle such that a shadow region exists on a second side of the gate stack; and forming a second extension region on the second side of the gate stack, the second extension region being formed by implanting a second doping material at a second angle such that a shadow region exists on the first side of the gate stack.

According to one embodiment of the present invention, a method of forming a field effect transistor (FET) capacitor is disclosed. The method includes forming an initial workpiece including a substrate, a insulator and a silicon layer on top of the substrate, the silicon layer having an upper surface; forming a gate stack on the upper surface; orienting the workpiece relative to a dopant material source in a first orientation such that first shadow region exist on a first side of the gate stack; implanting a first dopant material at the first orientation; orienting the workpiece relative to a dopant material source in a second orientation such that second shadow region exist on a second side of the gate stack; and implanting a second dopant material at the second orientation.

According to one embodiment of the present invention, a field effect transistor (FET) capacitor is disclosed. The FET capacitor includes a gate stack, a drain on a first side of the gate stack and a source on a second side of the gate stack. The drain includes a first dopant material and the source includes a second dopant material different than the first dopant material.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

One possible solution to the problems described above and which is disclosed herein is to alternate the carrier type in the diffusion regions in a FET capacitor array. That is, after the gate is formed, the source may be P+ doped and the drain N+ doped (or vice versa). Such a configuration would allow for high frequency switching because both accumulation and inversion have a particular diffusion region to draw either electrons or holes from. Without having both P+ and N+ regions, the FET capacitor would operate quickly in one voltage setting and slow in the other. As such, it may not be useful in a high frequency setting.

Such a solution, however, may require utilizing a non self-aligned blocking mask over the gate of the capacitor, which would limit how small the gate length of such a structure could be. In turn, the frequency response of the FET capacitor is a function of the gate length. This is because the carriers to form either an inversion layer or an accumulation layer must be supplied from either an N+ or P+ diffusion node and then propagate along the channel length.

Typically, doping diffusion nodes that form a source and drain is done in a vertical orientation. According to one embodiment, the doping is done at an angle and the gate itself forms the mask as it blocks the impingement of the doping molecules from either the source or drain as desired. Utilizing the gate as a mask in this manner allows for the creation of a self-aligned FET capacitor structure with alternating N+/P+ diffusion contacts. Since this structure is self-aligned, it may be scaled to shorter lengths and, thus, have higher frequency response.

Figure 1:
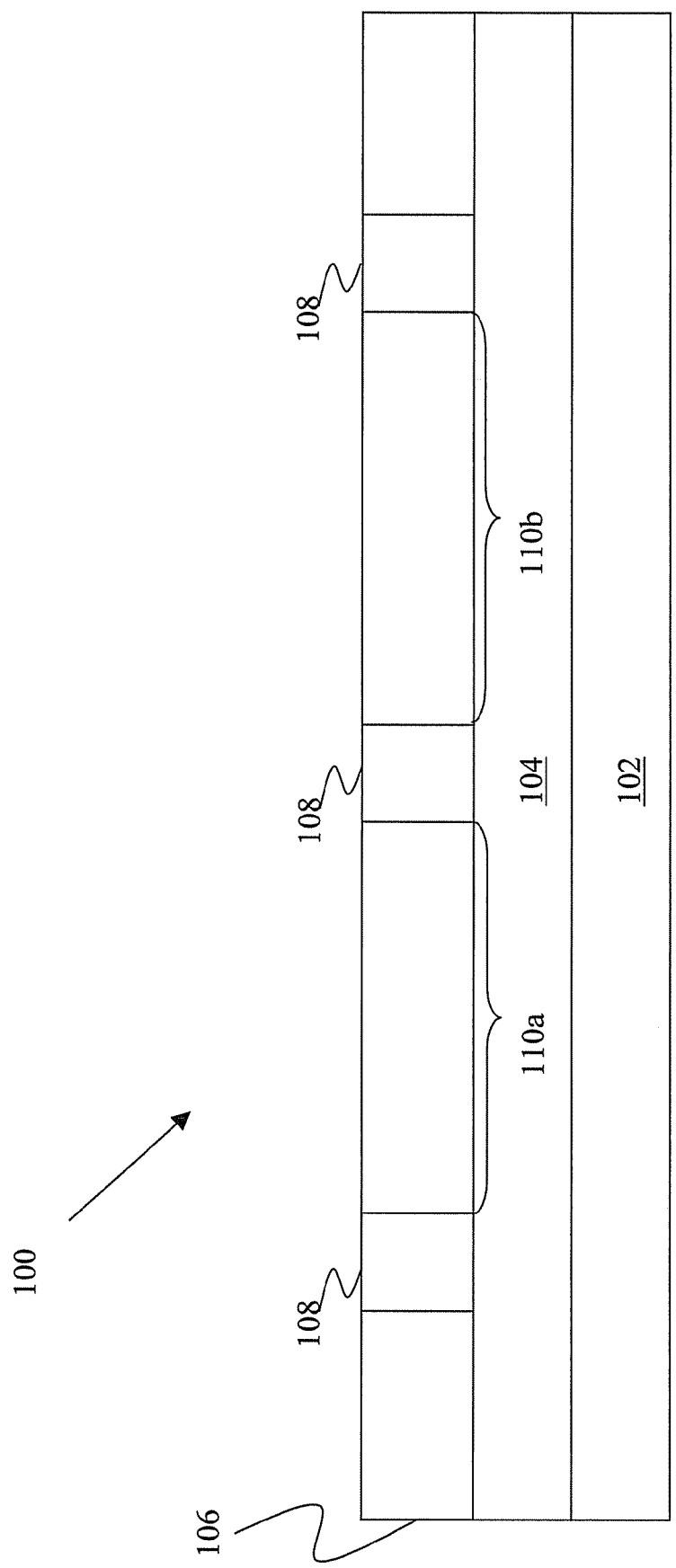
FIG. 1 shows a structure at one point in the process flow of forming a bi-directional capacitor according to one embodiment of the present invention.

FIG. 1 shows a structure 100 at one point in the process flow of forming a bi-directional capacitor according to one embodiment of the present invention. The structure 100 includes a substrate 102. The substrate 102 may be formed of any material but, in one embodiment, is formed of silicon or a silicon based material. An insulating layer 104 is disposed on top of the substrate 102. The insulating layer 104 may be formed of any electrical insulator. In one embodiment, the insulating layer 104 is formed of a nitride. In another embodiment, the insulating layer 104 is a Buried OXide (BOX) layer.

A silicon layer 106 is formed on top of the insulating layer 104. The combination of the substrate 102, the insulating layer 104 and the silicon layer 106, form a typical silicon-on-insulator (SOI) structure. The use of an SOI structure in place of conventional silicon substrate in semiconductor manufacturing, especially microelectronics, reduces parasitic device capacitance and, thereby, improves performance.

The silicon layer 106 is divided into multiple active regions 110 by one or more isolation regions 108. In one embodiment, the isolation regions 108 are shallow trench isolation (STI) regions. The number of isolation regions 108 is variable. As shown, there are two active regions, a first active region 110a and a second active region 110b. Of course, the number of active regions 110 is variable.

Figure 2:
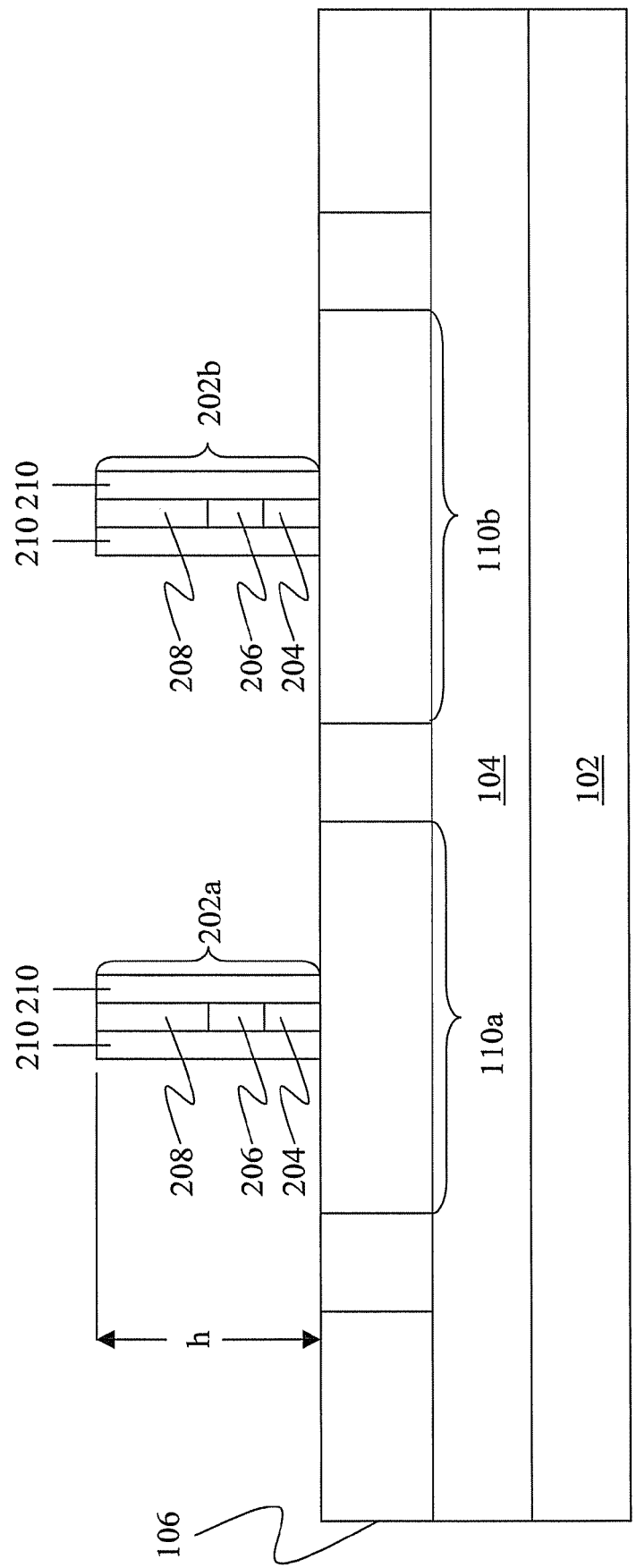
FIG. 2 shows the structure of FIG. 1 after a gate stack has been added.

FIG. 2 shows the structure of FIG. 1 after a gate stack 202 over the active regions. Each gate stack 202 may include a dielectric layer 204. In one embodiment, the dielectric layer 204 is a high-k dielectric. Each gate stack 202 may also include a gate 206 formed on top of the dielectric layer 204. As shown, there are two gate stacks 202a and 202b but this number is not limiting. In one embodiment, the gate 206 is formed of a metal. Each gate stack 202 may also include a polysilicon layer 208 formed on top of the gate 206. Each gate stack 202 may also include initial spacers 210 that protect the dielectric layer 204, the gate 206 and the polysilicon layer 208 from future processing steps. Each gate stack 202 may a height, h. In one embodiment, h is the same for all of the gate stacks but this is not required.

Figure 3:
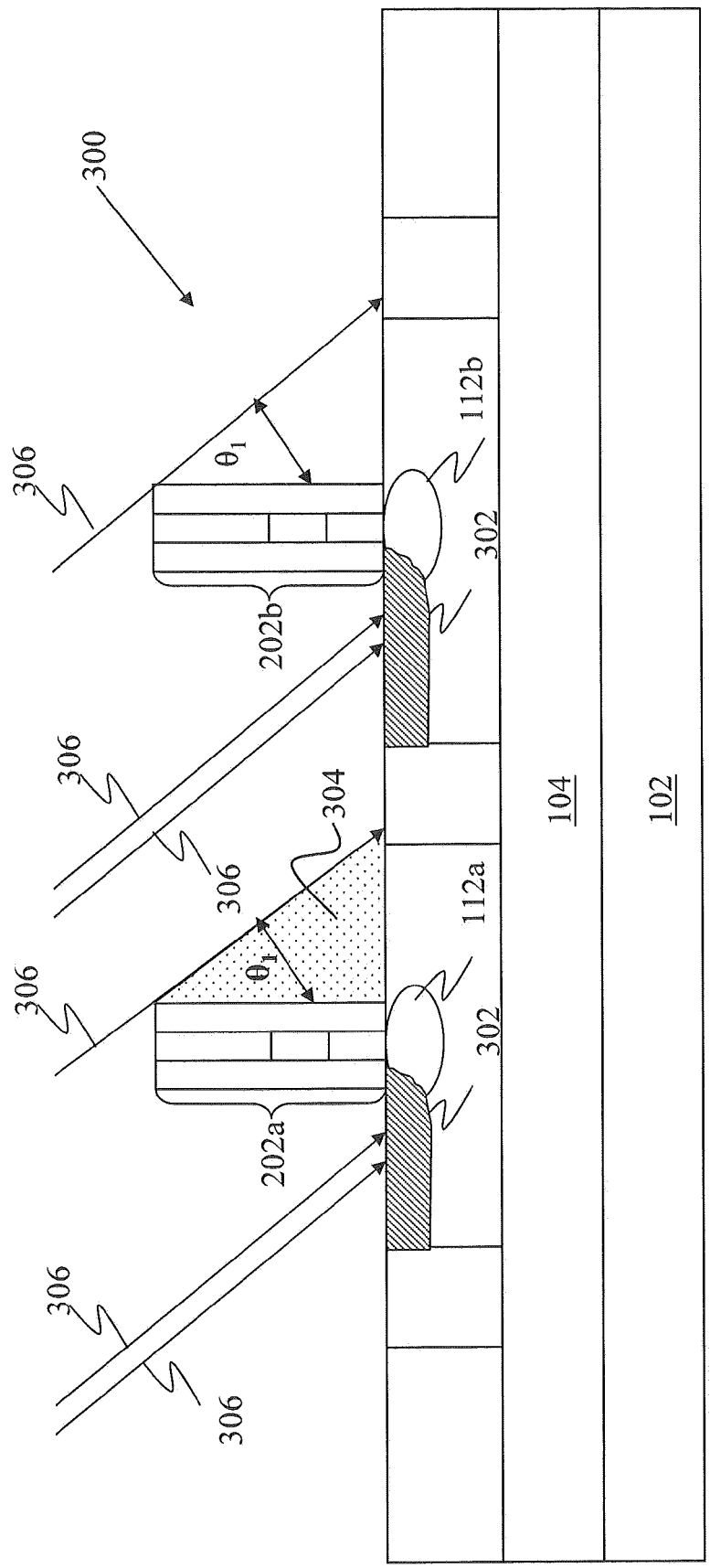
FIG. 3 shows the structure of FIG. 3 after a first extension region has been formed.

FIG. 3 shows the structure (workpiece 300) of FIG. 2 after a channel halo 112 formed therein has been formed below the gate stacks 202. The channel halos 112 may be formed in a conventional manner. The channel halos 112 may be formed be formed as either N-type or P-type regions. As shown, each gate stack (202a and 202b) includes a halo 112a and 112b, respectively, formed beneath it.

In addition, workpiece 300 includes a P-type extensions 302 formed on one side of one or more of the gate stacks 202. In one embodiment, the implant material source (not shown) and the workpiece 300 are arranged such that the implant material delivered is not delivered directly down on an upper surface of the workpiece 300. For example, the implant material may be directed as shown by first implant arrows 306. Because the implant arrows 306 are offset from vertical by an angle $\theta_1$ a shadow region 304 is formed on a side of the gate stack 202 opposite the side contacted by incoming implant material. In this manner, the angle $\theta_1$ and the height of the gate stack define a mask. These two variables may be finely tuned. In this example, the first implant arrows 306 indicate that a P-type material is being deposited.

Figure 4:
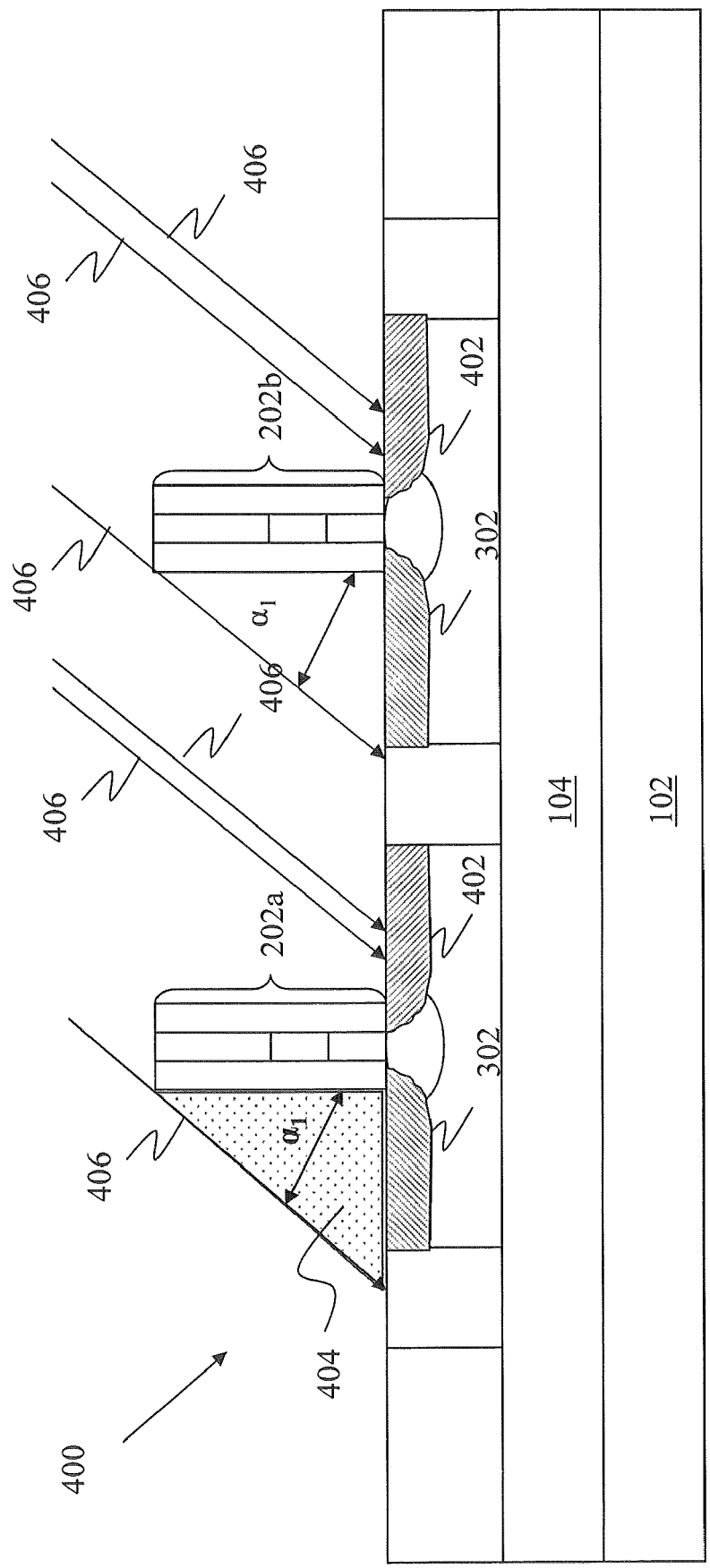
FIG. 4 shows the structure of FIG. 4 after a second extension region has been formed on an opposite side of the gate stack than the first extension region.

FIG. 4 shows the structure (workpiece 400) of FIG. 3 after an N-type extension 402 has been formed on one side of one or more of the gate stacks 202. In one embodiment, the implant material source (not shown) and the workpiece 400 are arranged such that the implant material is not delivered directly down on an upper surface of the workpiece 400. For example, the implant material may be directed as shown by second implant arrows 406. Because the implant arrows are offset from vertical by an angle $\alpha$ a shadow region 404 is formed on a side of the gate stack 202 opposite the side contacted by incoming implant material. In this manner, the angle $\alpha_1$ and the height of the gate stack define a mask. In this example, the first implant arrows 406 indicate that a N-type material is being deposited. In one embodiment, $\alpha_1$ is an opposite and equal angle to $\theta_1$ (FIG. 3).

Figure 5:
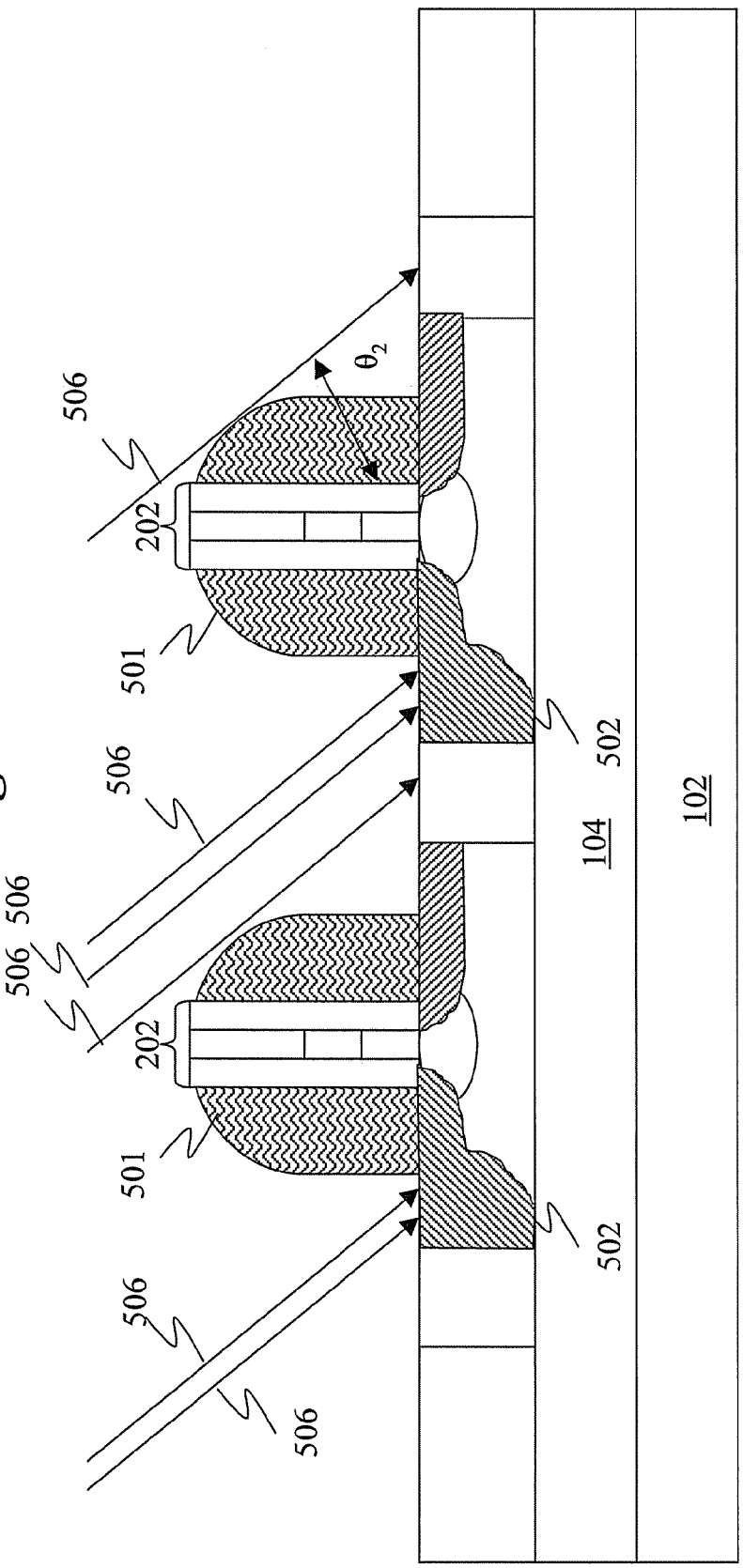
FIG. 5 shows structure of FIG. 4 after a spacer has been added around the gate stack and the first extension has been increased in size.

FIG. 5 shows the structure of FIG. 4 after spacers 501 have been formed around the gate stacks 200. The spacers 501 may, in one embodiment, may cover the P-type extensions 302 and the N-type extensions 304. After the spacers are formed, the first implant material is again applied at second angle $\theta_2$ to create a P region 502 that extends from an upper surface of the workpiece to the insulating layer 104. For example, the implant material may be directed as shown by third implant arrows 506. In one embodiment, $\theta_2$ and $\theta_1$ are equal but that is not required.

Figure 6:
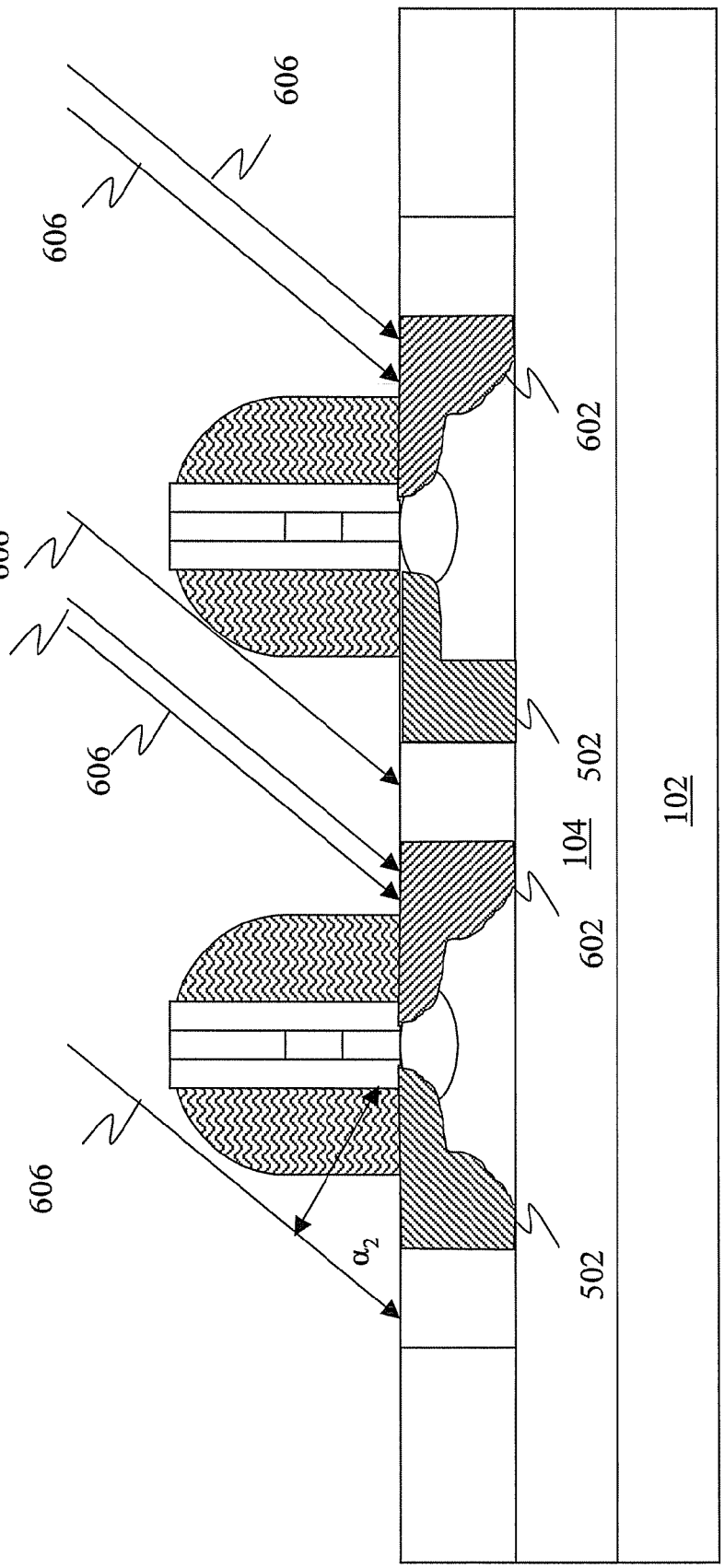
FIG. 6 shows the structure of FIG. 5 after the second extension has been increased in size.

FIG. 6 shows the structure of FIG. 5 the second implant material is again applied at angle $\alpha_2$ to create an N region 602 that extends from an upper surface of the workpiece to the insulating layer 104. For example, the implant material may be directed as shown by fourth implant arrows 606. In one embodiment, $\alpha_2$ and $\alpha_1$ are equal but that is not required. In one embodiment, $\alpha_2$ is an opposite and equal angle to $\theta_2$ (FIG. 5).

As discussed above, the incident angle of the implant material is shifted from the typical vertical orientation with respect to the workpiece. In one embodiment, the angle $\theta_1$ may be 20 degrees. In one embodiment, the angles $\theta_1$ and $\theta_2$ may vary from 1 to 89 degrees. Similarly, in one embodiment, the angle $\alpha_1$ may be 20 degrees. In one embodiment, the angles $\alpha_1$ and $\alpha_2$ may vary from 1 to 89 degrees.

It shall be understood that known silicide processes may be applied to the structure of FIG. 6 to create contacts. These contacts may allow the resulting structure to be used as a bidirectional FET capacitor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of forming a field effect transistor (FET) capacitor comprising:

forming an initial workpiece including a substrate, an insulator and a silicon layer on top of the substrate, the silicon layer having an upper surface;

dividing the workpiece into at least one active region with one or more isolation regions;

forming a gate stack on the upper surface within an active region;

orienting the workpiece relative to a dopant material source in a first orientation such that a first shadow region exists on a first side of the gate stack;

implanting a first dopant material at the first orientation to form a first extension region in the active region on only a first side of the gate stack;

orienting the workpiece relative to a dopant material source in a second orientation such that a second shadow region exists on a second side of the gate stack; and implanting a second dopant material at the second orientation to form a second extension region in the active region on only a second side of the gate stack.

2. The method of claim 1, further comprising:

forming a spacer around the gate stack;

orienting the workpiece in the first orientation and again implanting the first dopant material to form a source; and orienting the workpiece in the second orientation and again implanting the second dopant material to form a drain.

3. The method of claim 2, further comprising:

forming silicide contacts over the source, drain and gate stack.

4. The method of claim 1, wherein the gate stack has a height and the first and second shadow regions have the same area and are related to the height.

5. The method of claim 1, wherein the first dopant material is a P+ dopant material and the second dopant material is an N+ dopant material.

6. The method of claim 1, wherein the first dopant material is an N+ dopant material and the second dopant material is a P+ dopant material.

* * * * *